United States Patent
Hamane et al.

(10) Patent No.: US 11,116,119 B2
(45) Date of Patent: Sep. 7, 2021

(54) CONVEYANCE DEVICE AND MOUNTING-RELATED DEVICE

(71) Applicant: FUJI CORPORATION, Chiryu (JP)

(72) Inventors: Tsuyoshi Hamane, Toyota (JP); Shinji Ichino, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 68 days.

(21) Appl. No.: 16/484,517

(22) PCT Filed: Mar. 8, 2017

(86) PCT No.: PCT/JP2017/009259
§ 371 (c)(1),
(2) Date: Aug. 8, 2019

(87) PCT Pub. No.: WO2018/163324
PCT Pub. Date: Sep. 13, 2018

(65) Prior Publication Data
US 2020/0060051 A1 Feb. 20, 2020

(51) Int. Cl.
| H05K 13/02 | (2006.01) |
| B25J 9/06 | (2006.01) |
| B25J 11/00 | (2006.01) |
| H05K 3/34 | (2006.01) |
| H05K 13/04 | (2006.01) |

(52) U.S. Cl.
CPC ............. H05K 13/02 (2013.01); B25J 9/06 (2013.01); B25J 11/005 (2013.01); H05K 3/34 (2013.01); H05K 13/04 (2013.01)

(58) Field of Classification Search
None
See application file for complete search history.

(56) References Cited

U.S. PATENT DOCUMENTS

| 5,680,936 A | 10/1997 | Beers |
| 2003/0123971 A1 | 7/2003 | Koyama et al. |
| 2005/0108872 A1* | 5/2005 | Konrath ............ H05K 13/0061 29/831 |

(Continued)

FOREIGN PATENT DOCUMENTS

| CN | 1720769 A | 1/2006 |
| JP | 2001-156495 A | 6/2001 |

(Continued)

OTHER PUBLICATIONS

International Search Report dated Jun. 6, 2017 in PCT/JP2017/009259 filed Mar. 8, 2017.

*Primary Examiner* — Ronald P Jarrett (74) *Attorney, Agent, or Firm* — Oblon, McClelland, Maier & Neustadt, L.L.P.

(57) ABSTRACT

A conveyance device used in a mounting system including a mounting-related device for applying a viscous liquid to and/or arranging a member on a processing target. This conveyance device uses a pallet having a pallet-side attachment section that holds a processing target. In addition, the conveyance device includes having a robot-side attachment section arranged at a distal end section of the conveyance robot for mounting the pallet-side attachment section and the conveyance robot is configured to convey the pallet in a mounted state between a loading position and a discharge position.

6 Claims, 9 Drawing Sheets

(56) References Cited

U.S. PATENT DOCUMENTS

2018/0243869 A1* 8/2018 Mizuoka ............ H05K 13/0404

FOREIGN PATENT DOCUMENTS

| JP | 2003-197713 A | 7/2003 |
|----|---------------|--------|
| JP | 2005-123373 A | 5/2005 |
| JP | 2010-98180 A | 4/2010 |
| JP | 2011-68104 A | 4/2011 |
| JP | 2011-134822 A | 7/2011 |

* cited by examiner

CONVEYANCE DEVICE AND MOUNTING-RELATED DEVICE

TECHNICAL FIELD

The present disclosure relates to a conveyance device and a mounting-related device.

BACKGROUND ART

Conventionally, there are known devices for conveying a board, for example, a device that conveys a board by holding via suction a suction surface that is a main surface of circuit board (for example, refer to patent literature 1). With such a device, the circuit board is conveyed in a stable state even at high speed.

CITATION LIST

Patent Literature

Patent literature 1: JP-A-2010-98180

BRIEF SUMMARY

Technical Problem

Electronic components are mounted onto circuit boards. In recent years, the density of mounting such electronic components has increased, and there are cases in which the circuit board is a three-dimensional object with multiple mounting surfaces. With a conveyance device disclosed in patent literature 1, it is possible to transfer a circuit board, but the device does not suppose conveying a three-dimensional board or the like with a special shape. Conventionally, board conveyance is performed by a conveyor belt along a conveyance path, but there is a demand, for example, for flexible conveyance of a board with a special shape or the like.

The present disclosure takes account of such circumstances and a main object thereof is to provide a conveyance device and a mounting-related device capable of flexibly conveying a processing target object.

Solution to Problem

The present disclosure employs the following means to achieve the above object.

A conveyance device of the present disclosure is for use in a mounting system including a mounting-related device for applying a viscous fluid to and/or arranging a member on a processing target, the conveyance device including: a conveyance robot configured to use a pallet having a pallet-side attachment section and configured to hold the processing target, the conveyance robot having a robot-side attachment section arranged at a distal end section of the conveyance robot for mounting the pallet-side attachment section, wherein the conveyance robot is configured to convey the pallet in a mounted state between a loading position and a discharge position.

With this device, a pallet holding a processing target object is used to carry the object between a loading position and a discharge position. For example, even in a case where the processing target has a special shape, with this device, since the processing target is transported by using a pallet, handling equivalent to a flat board is possible, and general-purpose conveyance of a processing target object can be performed.

DESCRIPTION OF EMBODIMENTS

Figure 1:
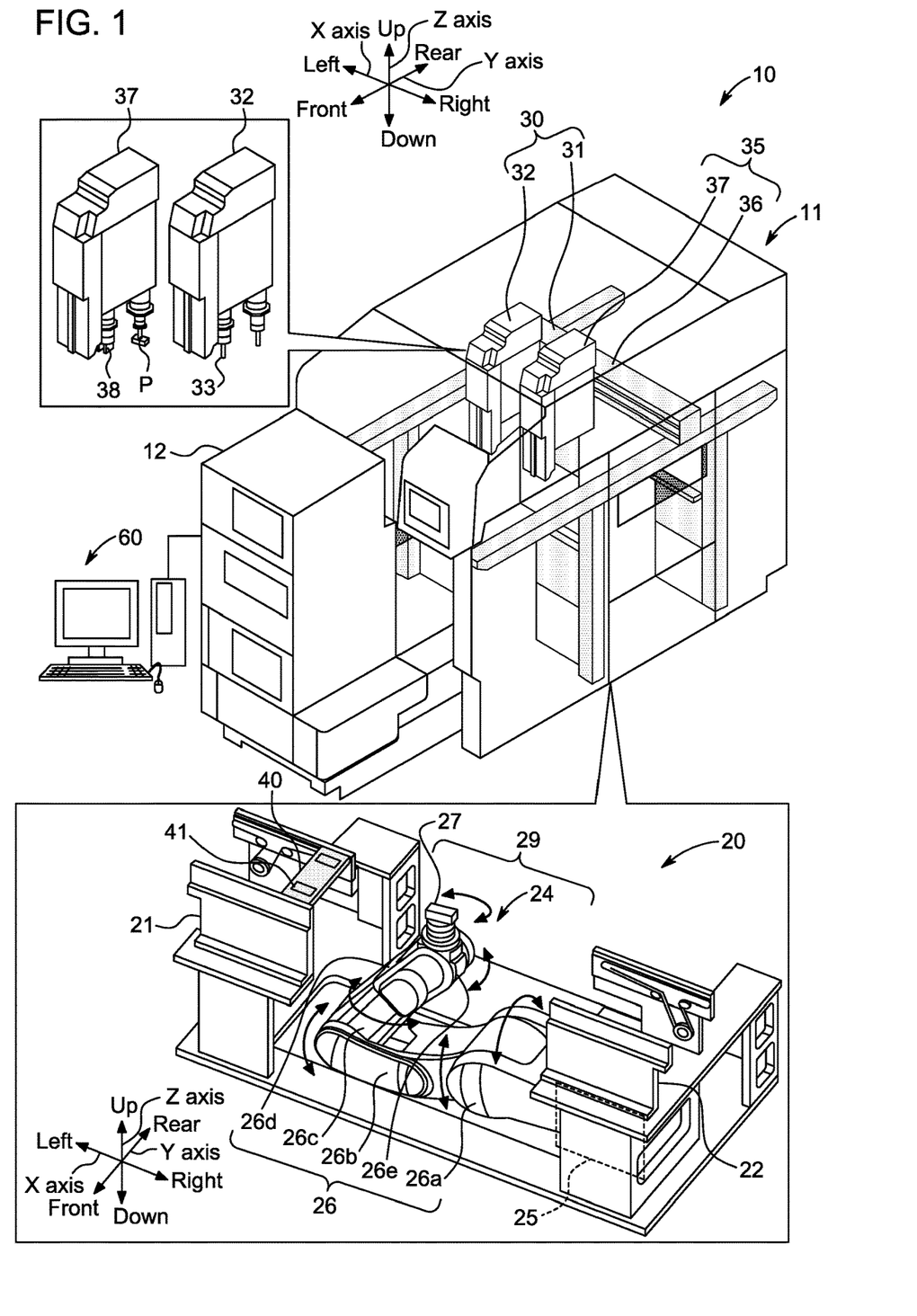
FIG. 1 is a schematic view of mounting system 10.
Figure 2:
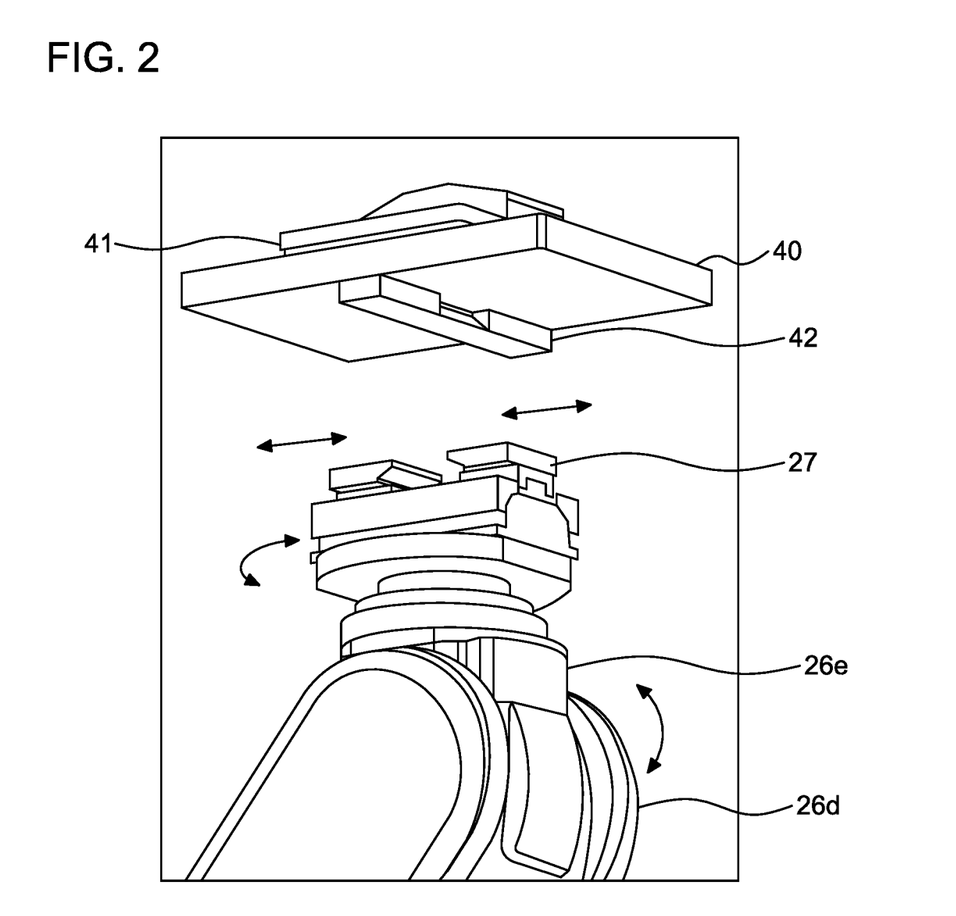
FIG. 2 illustrates the configuration of robot-side attachment section 27 and conveyance pallet 40.
Figure 3:
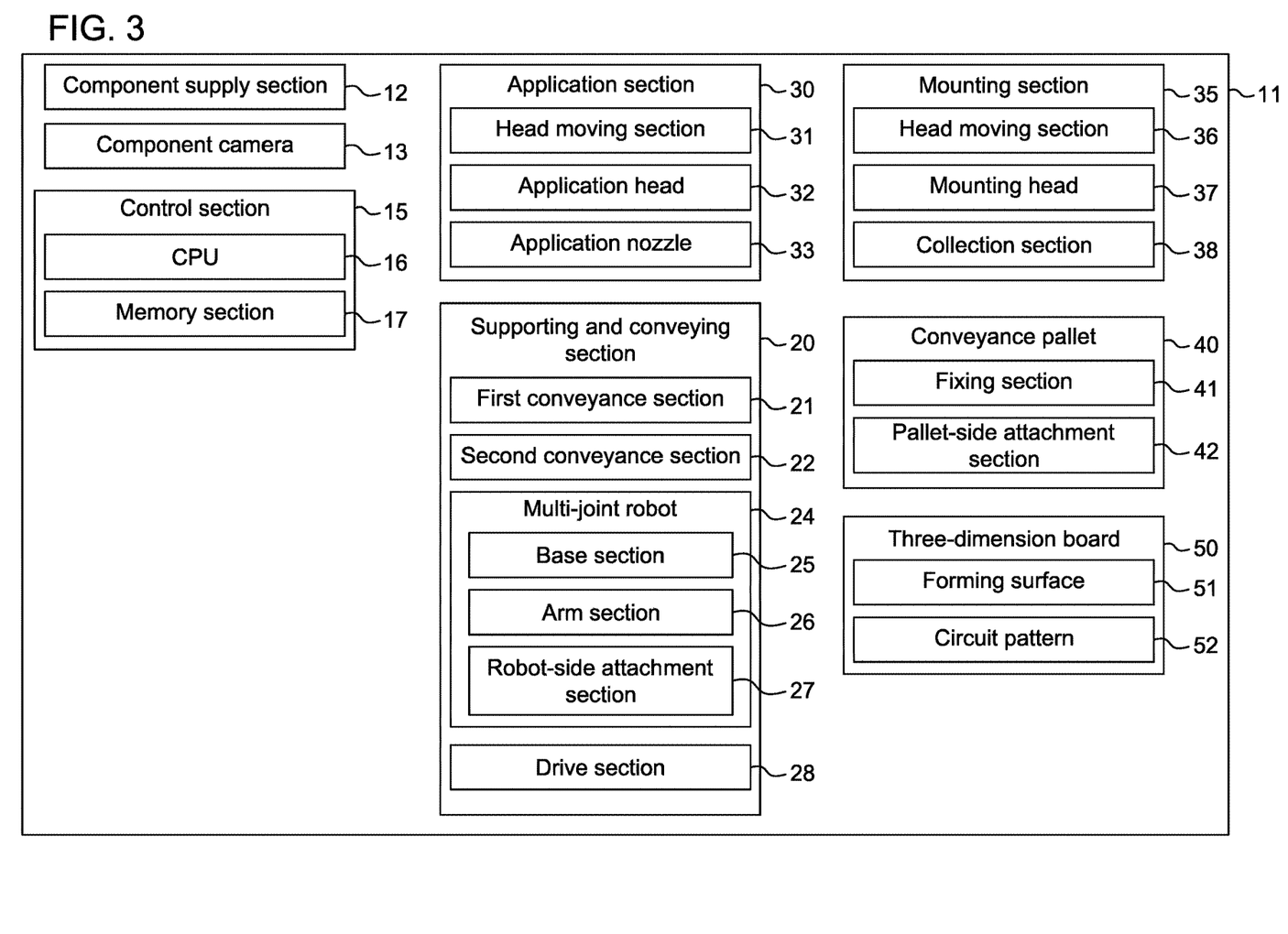
FIG. 3 is a block diagram of the configuration of three-dimensional mounting device 11.
Figure 4:
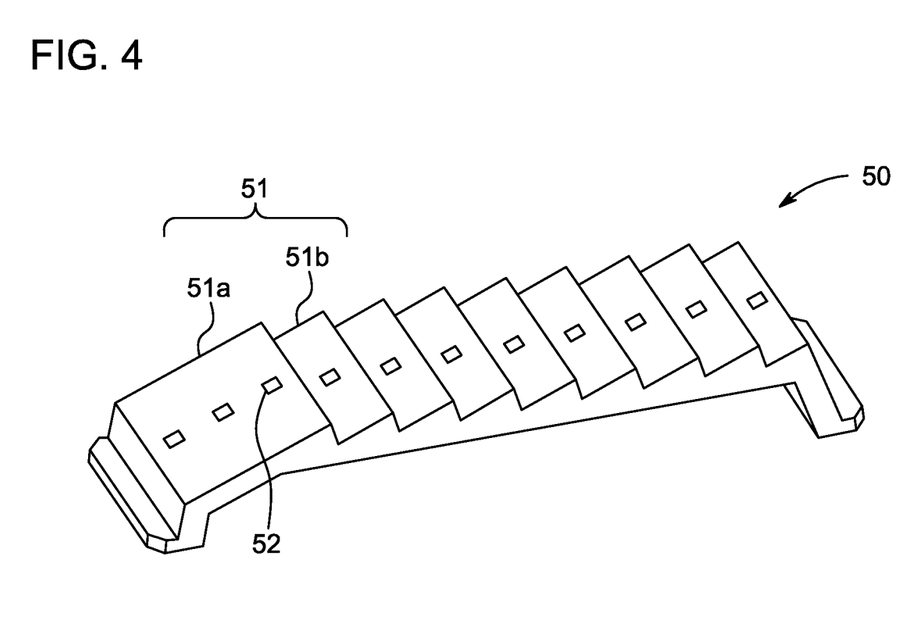
FIG. 4 illustrates an example of three-dimensional board 50 as a processing target.
Figure 5:
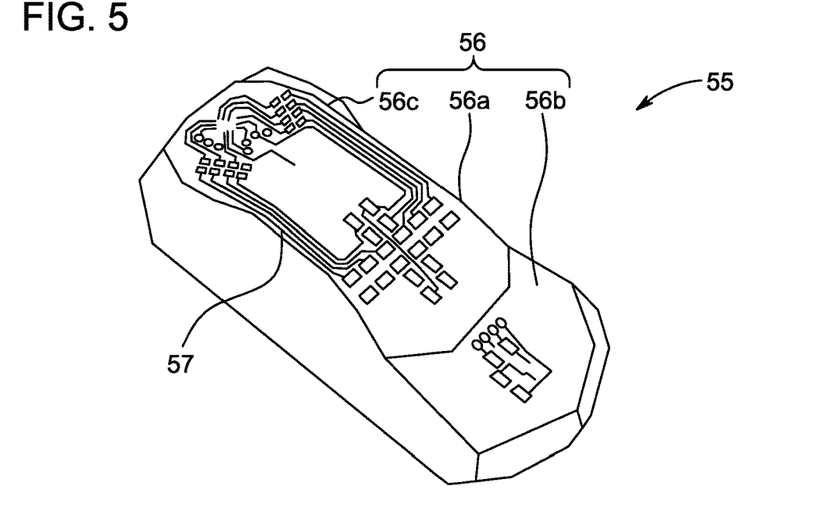
FIG. 5 illustrates an example of three-dimensional board 55 as a processing target.
Figure 6:
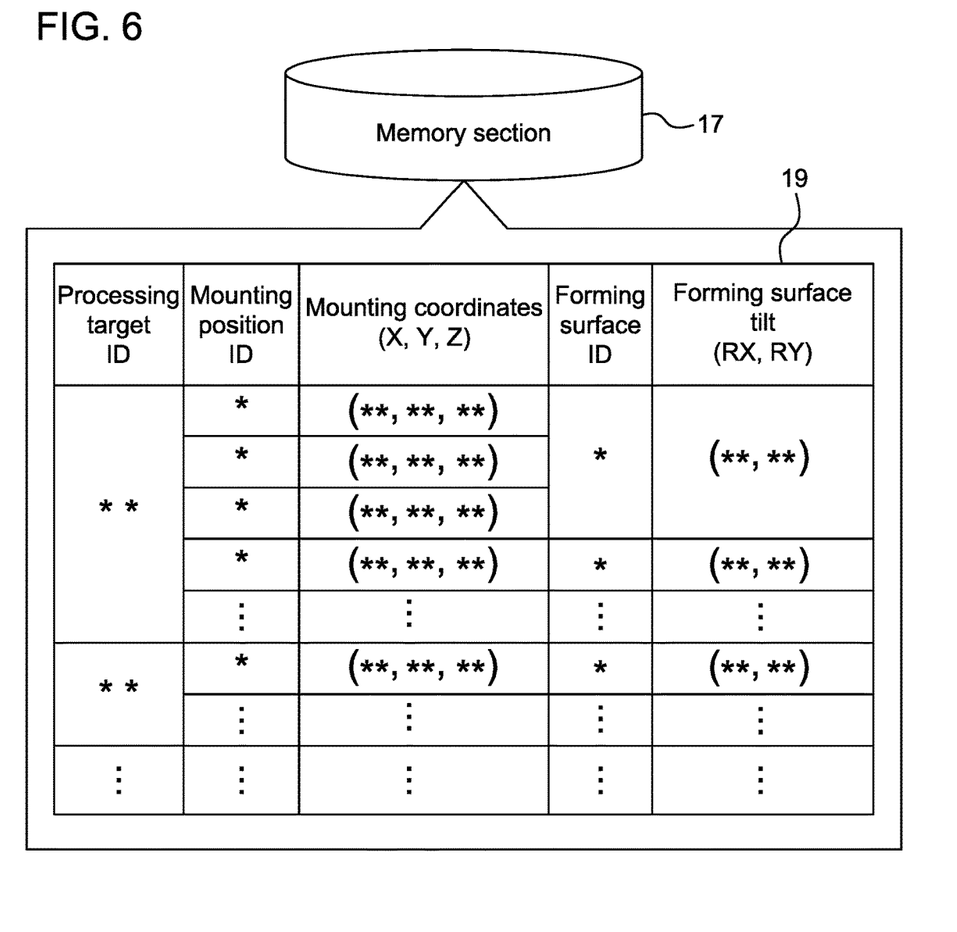
FIG. 6 illustrates three-dimensional data 19 of a processing target memorized on memory section 17.

The present embodiment will be described below with reference to the drawings. FIG. 1 is a schematic illustration of mounting system 10 that is an example of the present disclosure. FIG. 2 illustrates the configuration of robot-side attachment section 27 of multi joint robot 24 and conveyance pallet 40. FIG. 3 is a block diagram of the configuration of three-dimensional mounting device 11. FIGS. 4 and 5 illustrate three-dimensional boards 50 and 55, which are example of a processing target. FIG. 6 illustrates three-dimensional data 19 of a processing target memorized on memory section 17. As shown in FIG. 1, mounting system 10 includes three-dimensional mounting device 11, a reflow oven (not shown), and management computer (PC) 60. Three-dimensional mounting device 11 is a device for applying a viscous fluid to and arranging members such as components P on three-dimensional boards 50 and 55 (see FIGS. 4 and 5) as three-dimensional processing targets. Note that the viscous fluid includes a solder paste, a conductive paste, an adhesive, grease, and the like. A reflow oven is a device for performing reflow processing of heating a three-dimensional board on which components are arranged on a viscous fluid. Management PC 60 stores mounting condition information. Mounting condition information defines which components are mounted on the three-dimensional board in which order, the number of such three-dimensional boards required to be produced, and the like. Mounting condition information defines which components are mounted on the three-dimensional board in which order, the number of such three-dimensional boards required to be produced, and the like. The mounting condition information includes three-dimensional data such as the application position of the viscous fluid to be processed by three-dimensional mounting device 11 and the shape and position of the circuit pattern used as the arrangement position of the component. In the present embodiment, left-right directions (X axis), front-rear directions (Y axis), and up-down directions (Z axis) are set as shown in FIG. 1.

As shown in FIG. 4, three-dimensional board 50 as a processing target is a three-dimensional object having multiple forming surface 51 including forming surface 51a and forming surface 51b on which circuit pattern 52 is formed. Three-dimensional board 50 has stepped forming surface 51a and forming surface 51b, and the like, and a mounting position (arrangement position) where the component P is to be arranged is defined on these surfaces. Three-dimensional board 50 has a shape in which forming surface 51a and forming surface 51b are inclined with respect to the horizontal plane when three-dimensional board 50 is loaded on a horizontal surface. In addition, when three-dimensional board 50 is loaded on a horizontal surface, the mounting position of forming surface 51a and the mounting position of forming surface 51b are at a different height. As shown in FIG. 5, three-dimensional board 55 is a three-dimensional object having multiple forming surfaces 56 including forming surfaces 56a, 56b, 56c, and the like on which a circuit pattern 57 is formed. Three-dimensional boards 50 and 55 are collectively referred to as three-dimensional boards, forming surfaces 51 and 56 are collectively referred to as forming surfaces, and circuit patterns 52 and 57 are collectively referred to as circuit patterns. In addition, for a forming surface 56 with a curved surface on which the circuit pattern 57 is formed, even though the curved surface is the same, when the slope of the three-dimensional board 55 must be changed to perform application and mounting due to differences in heights and angles, this shall be treated as multiple forming surfaces 56. The processing target may have a curved surface or a flat surface, and the mounting position may be on any of the top side, a side surface side, or the bottom side.

Three-dimensional mounting device 11 is a device for performing processing of applying a viscous fluid to and processing of mounting components P on three-dimensional boards 50 and 55 having a three-dimensional mounting surface. Three-dimensional mounting device 11 includes component supply section 12, component camera 13, control section 15, supporting and conveying section 20, application section 30, a mounting section 35, and the like.

Component supply section 12 is a section that supplies components P to mounting section 35. Component supply section 12 includes, for example, a feeder on which tape holding components P is mounted, a tray on which components P are mounted in an array, and the like. Component camera 13 captures an image of one or more components P picked up by mounting head 37 of mounting section 35 from below. A range above component camera 13 is an imaging range.

Control section 15 is configured as a microprocessor centered on CPU 16, and includes storage section 17 for storing various data. Control section 15 exchanges information with component supply section 12, component camera 13, supporting and conveying section 20, application section 30, mounting section 35, and the like. With three-dimensional mounting device 11, control section 15 performs application processing of causing application section 30 to apply the viscous fluid to the forming surface of the three-dimensional board, and mounting processing of causing mounting section 35 to arrange component P on the forming surface of the three-dimensional board. As shown in FIG. 6, mounting condition information including three-dimensional shape data 19 is memorized in memory section 17. Three-dimensional mounting device 11 acquires the mounting condition information from management PC 60 by communication, and memorizes the mounting condition information in memory section 17. Three-dimensional data 19 is data including information on a three-dimensional structure of a three-dimensional object such as the three-dimensional boards 50 and 55, which is created by CAD or the like, for example. Three-dimensional data 19 includes, for example, three-dimensional coordinates (X, Y, Z) based on a specified origin as a reference, information on the direction of the outer surface at those coordinates (for example, normal vector), and the like. Further, three-dimensional data 19 includes identification information (ID) of the processing target, a mounting position ID of the processing target, mounting coordinates (X, Y, Z), identification information (ID) of the forming surface including the mounting position, inclination information including inclination RX due to rotation of the forming surface including the mounting position in the X axis direction as the center axis, inclination information including inclination RY due to rotation with the Y axis direction as the center axis, and the like.

Supporting and conveying section 20 is a unit that can convey a three-dimensional board and fix the three-dimensional board by adjusting an inclination angle of the three-dimensional board. As shown in FIG. 1, supporting and conveying section 20 includes first conveyance section 21, second conveyance section 22, multi joint robot 24, and drive section 28. First conveyance section 21 is a conveyor that conveys conveyance pallet 40 on which the three-dimensional board is fixed from the entrance of the device to the loading position. First conveyance section 21 has a pair of conveyor belts which are provided separated in the front-rear direction of FIG. 1 and span first conveyance section 21 in the left-right direction. Conveyance pallet 40 is conveyed by the conveyor belt. Second conveyance section 22 is a conveyor that discharges conveyance pallet 40 (pedestal) holding the three-dimensional board from the discharge position to the outlet of the device. Second conveyance section 22 has the same configuration as first conveyance section 21. In supporting and conveying section 20, movable space 29 in which multi joint robot 24 is disposed and operates is formed below the moving regions of application head 32 and mounting head 37 and between first conveyance section 21 and second conveyance section 22.

As shown in FIGS. 1 to 3, conveyance pallet 40 includes fixing section 41 for fixing a three-dimensional board and pallet-side attachment section 42 held by arm section 26. Fixing section 41 may be any mechanism as long as it fixes the three-dimensional board, for example, a clamp mechanism that clamps the three-dimensional board by a spring force or a mechanism that fixes the three-dimensional board with a screw. As shown in FIG. 2, pallet-side attachment section 42 may be a clamp plate removably fixed to conveyance pallet 40. The clamp plate is formed with a groove or a concave portion to be gripped by robot-side attachment section 27.

Multi-joint robot 24 is a supporting section capable of fixing a three-dimensional board. Multi joint robot 24 grips conveyance pallet 40 to which the three-dimensional board is fixed, and moves conveyance pallet 40 to a loading position, a processing position, and a discharge position. Multi joint robot 24 has multiple tilt axes and is capable of tilting the three-dimensional board in multiple directions, and maintains the three-dimensional board in an attitude changeable with respect to application head 32 and mounting head 37. The larger the quantity of tilt axes, the easier it is to change the attitude of the three-dimensional board, and it is preferable that there are at least four tilt axes. Multi-joint robot 24 has six tilt axes. Multi joint robot 24 has base section 25, arm section 26, and robot-side attachment section 27. Base section 25 is fixed to the device housing in a state supporting arm section 26. Multi joint robot 24 is a vertical multi joint robot, and the axial direction of base portion 25 is fixed to a direction along a horizontal direction, for example, a direction (X axis) along a moving direction of the three-dimensional board. That is, supporting and conveying section 20 includes a vertical multi joint robot placed horizontally. By arranging multi joint robot 24 in this manner, it is possible to tilt the three-dimensional board in the limited movable space 29 or to lower the three-dimensional board to a position lower than the conveyance height of first conveyance section 21 or second conveyance section 22.

Arm section 26 has first arm 26a, second arm 26b, third arm 26c, fourth arm 26d, and fifth arm 26e. First arm 26a is disposed on base section 25 so as to be rotatable about the X axis. Second arm 26b is pivotally supported by first arm 26a so as to be able to swing mainly in the vertical direction. Third arm 26c is pivotally supported by second arm 26b so as to be able to swing mainly in the left-right direction. Fourth arm 26d is arranged on third arm 26c so as to be rotatable about the main axis of third arm 26c. Fifth arm 26e is pivotally supported by fourth arm 26d so as to be able to swing mainly in the left-right direction. Fifth arm 26e is provided with robot-side attachment section 27 that is rotatable about its main axis. Robot-side attachment section 27 is a mechanical chuck provided at the distal end of arm section 26 and that grips and fixes pallet-side attachment section 42 (clamp plate). Robot-side attachment section 27 is opened and closed by a pressure supplied from the main body. Drive section 28 includes, for example, a motor for driving the conveyor belts of first conveyance section 21 and second conveyance section 22, a motor for rotating or swinging each member of arm section 26, and the like. Multi joint robot 24 transports the three-dimensional board between the loading position, the processing position, and the discharge position in a state mounted on conveyance pallet 40. At this time, multi-joint robot 24 grips pallet-side attachment section 42 of conveyance pallet 40 in first conveyance section 21, transfers conveyance pallet 40, and releases the pallet-side attachment section 42 at second conveyance section 22.

Application section 30 is an application unit that applies a viscous fluid to a three-dimensional board fixed to supporting and conveying section 20. Application section 30 includes head moving section 31, application head 32, and application nozzle 33. Head moving section 31 is provided with sliders that move in XY directions guided by guide rails and motors that drive the sliders. Application section 30 is configured as an XY robot that moves application head 32 as a processing head in the XY plane direction. Application nozzle 33 is detachably mounted on the lower surface side of application head 32. Application nozzle 33 is a nozzle for supplying a predetermined amount of the viscous fluid from the tip end of application nozzle 33 by pressure being applied to the housing section that houses the viscous fluid.

Mounting section 35 is a mounting unit that collects component P from component supply section 12 and arranges the component P on a three-dimensional board fixed to supporting and conveying section 20. Mounting section 35 includes head moving section 36, mounting head 37, and collection section 38. Head moving section 36 is provided with sliders that move in XY directions guided by guide rails and motors that drive the sliders. Mounting section 35 is configured as an XY robot that moves mounting head 37 as a processing head in the XY plane direction. Collection section 38 is a member that is removably mounted on the lower surface side of mounting head 37 and that collects component P. Collection section 38 may be a suction nozzle for collecting the component P using negative pressure, or may be a mechanical chuck for mechanically gripping the component P. Mounting head 37 is configured to be capable of holding one or more collection sections 38. Head moving section 36 may share a part of the slider with head moving section 31. Application head 32 and mounting head 37 may have the same structure, and application nozzle 33 and collection section 38 may be freely attached as tools.

Figure 7:
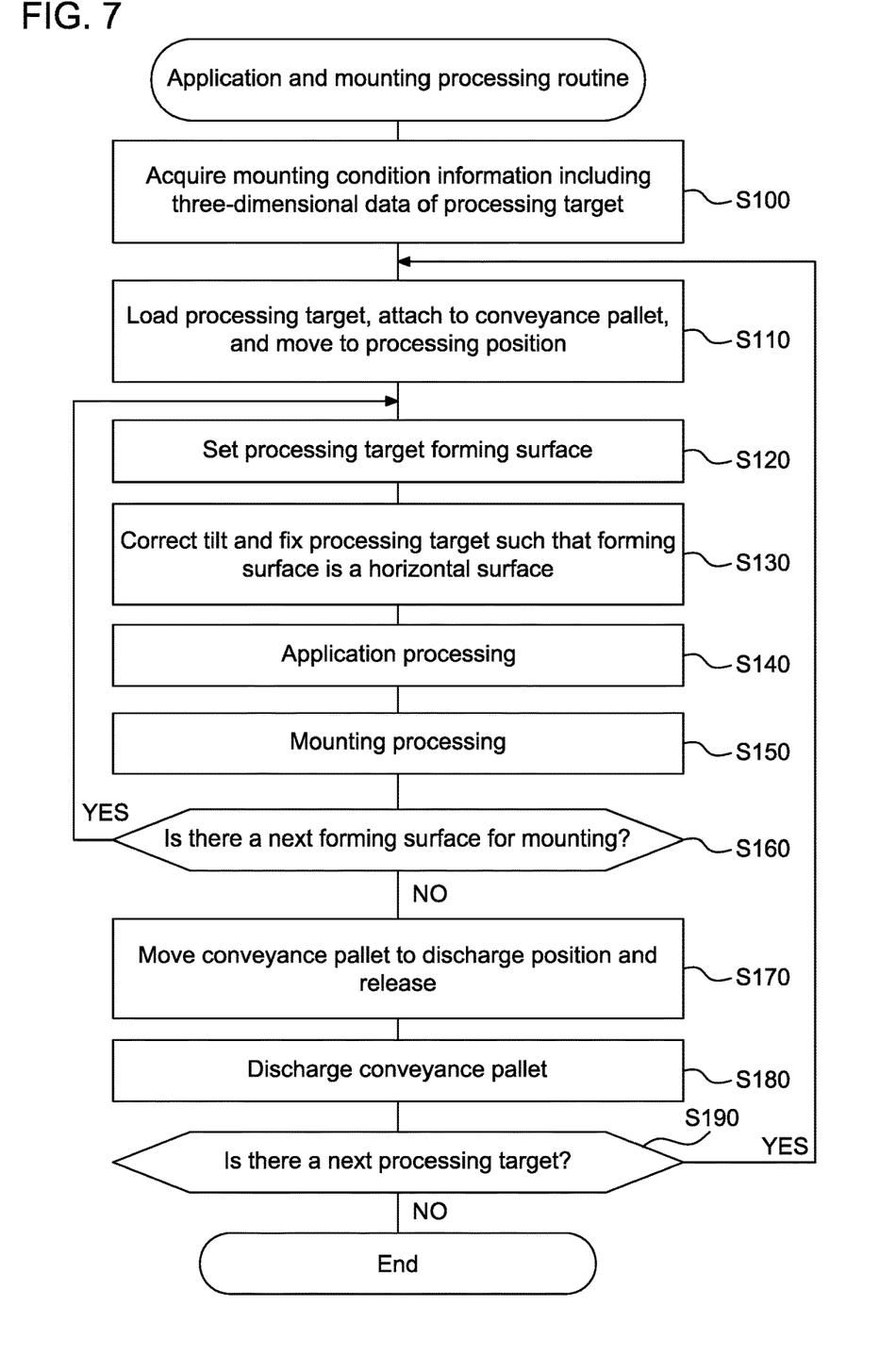
FIG. 7 is a flowchart showing an example of an application and mounting processing routine.

Next, operation of mounting system 10 of the present embodiment configured as described above, in particular, the application process and the mounting process executed by three-dimensional mounting device 11 will be described. FIG. 7 is a flowchart showing an example of application and mounting processing executed by CPU 16 of control section 15. This routine is memorized in memory section 17 and is executed based on a mounting start input from an operator.

Figure 8:
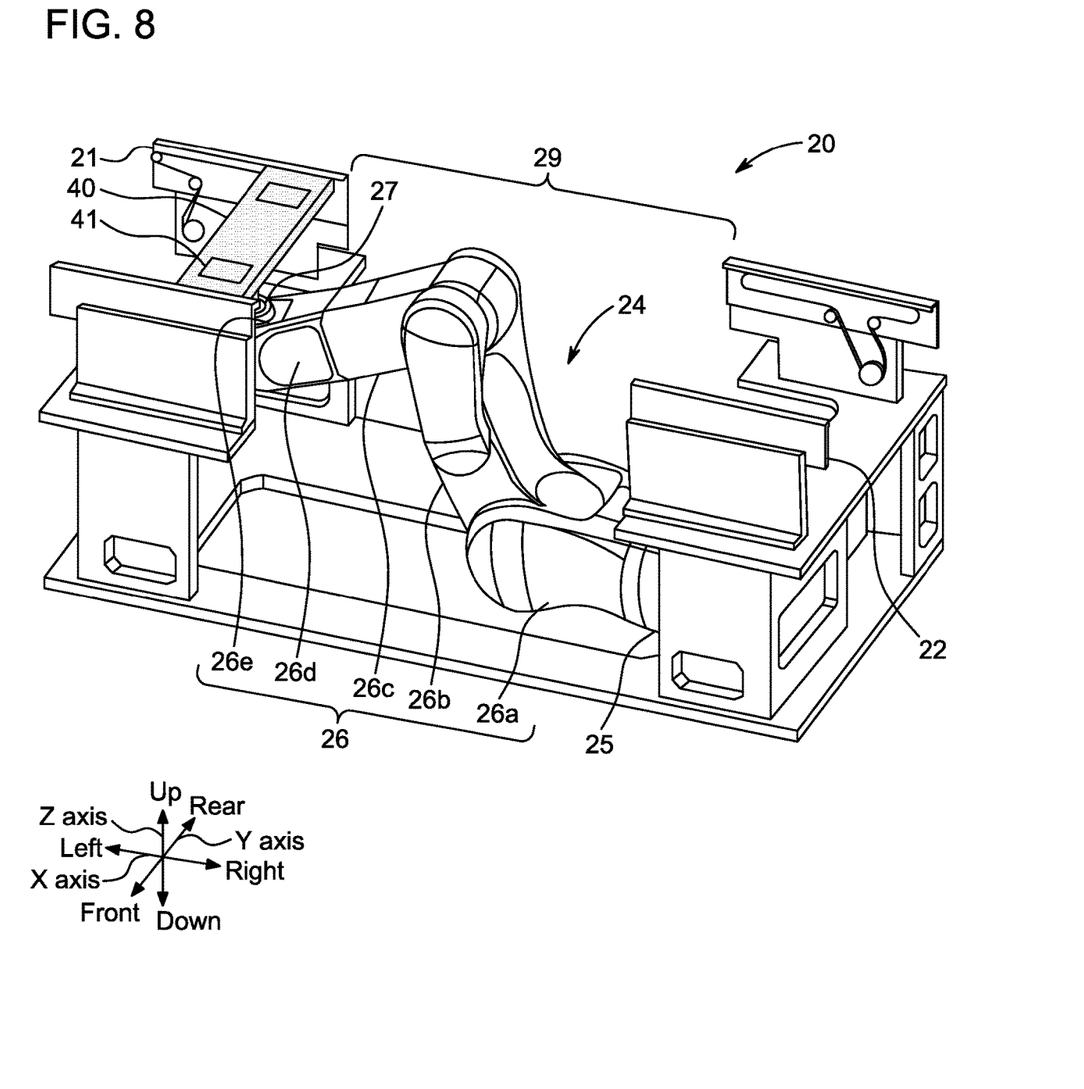
FIG. 8 illustrates supporting and conveying section 20 on which conveyance pallet 40 is loaded at a loading position.
Figure 9:
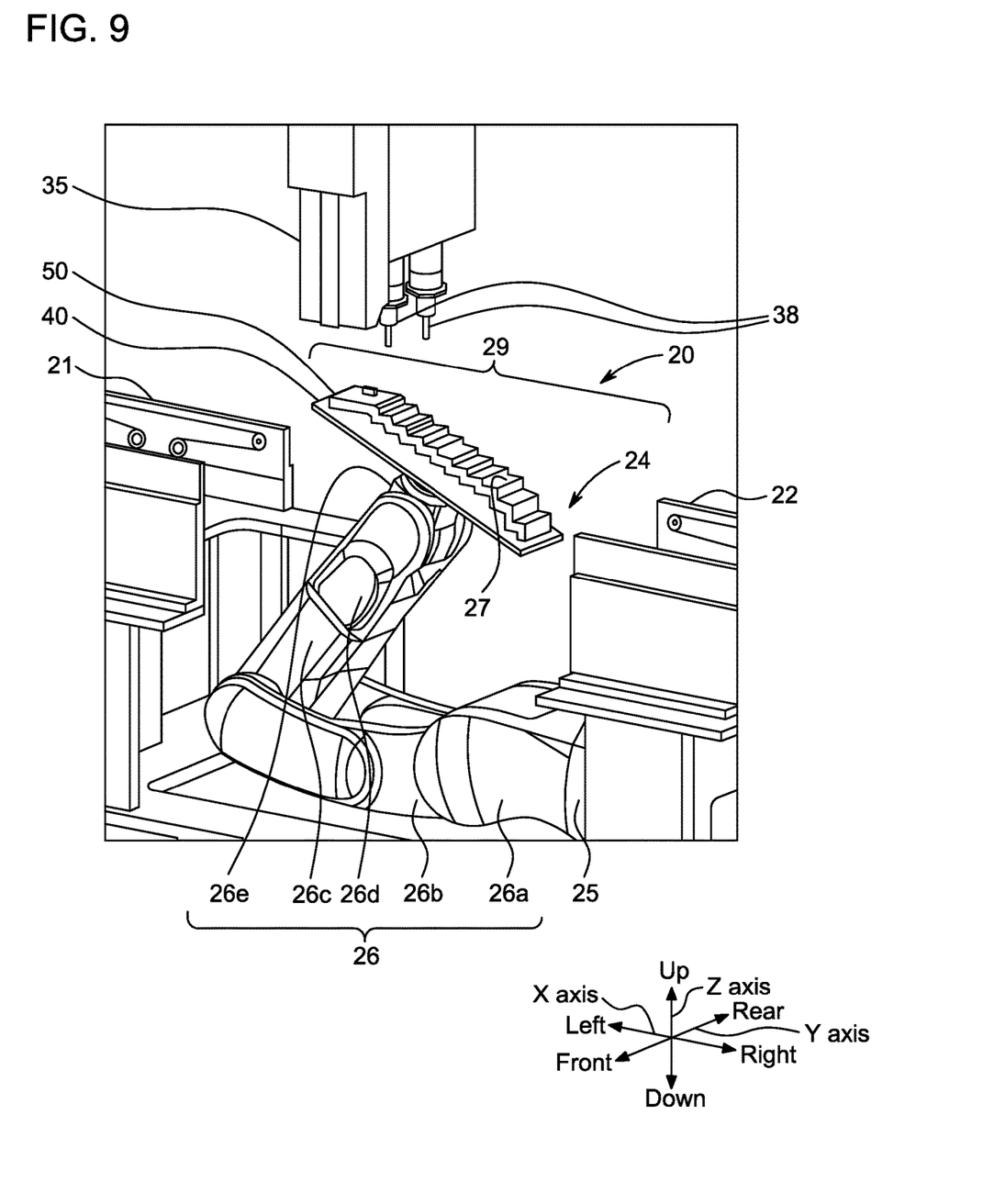
FIG. 9 illustrates supporting and conveying section 20 on which conveyance pallet 40 is fixed at a processing position.

When the routine is initiated, CPU 16 first acquires mounting condition information including three-dimensional data of three-dimensional board to be processed from management PC 60 (S100), uses first conveyance section 21 to load conveyance pallet 40 in which the three-dimensional board is fixed, and mounts conveyance pallet 40 on arm section 26 and moves it to the processing position (S110). FIG. 8 illustrates supporting and conveying section 20 on which conveyance pallet 40 is loaded at an introduction position. FIG. 9 illustrates supporting and conveying section 20 on which conveyance pallet 40 is fixed at a processing position. CPU 16 controls first conveyance section 21 to move conveyance pallet 40 to the loading position, and controls multi-joint robot 24 so that robot-side attachment section 27 grips pallet-side attachment section 42 below conveyance pallet 40 (refer to FIG. 8). Next, CPU 16 controls multi-joint robot 24 to move conveyance pallet 40 to the processing position, which is at the center of movable space 29 (refer to FIG. 9).

Next, CPU 16 sets a forming surface as a processing target on which viscous fluid is to be applied and component P arranged (S120). For example, CPU 16 can set the forming surface of the processing target based on the three-dimensional data 19 of the processing target including the mounting order. Next, the CPU 16 corrects and fixes the inclination of the three-dimensional board as required so that the forming surface that is the processing target becomes a horizontal surface (S130). CPU 16 fixes the processing target to the multi joint robot 24 based on the inclination of the forming surface included in the three-dimensional data 19 of the processing target such that the forming surface becomes a horizontal plane. At this time, CPU 16 controls multi joint robot 24 such that the forming surface of the processing target becomes a specified mountable height. It should be noted that the term "horizontal" may be used to indicate a change in the attitude of the three-dimensional board so that the position where the component P is arranged becomes horizontal, and when the forming surface is a curved surface, the attitude of the three-dimensional board may be changed such that a central portion, a portion where the arrangement density of components P is high, or the like becomes horizontal.

Figure 10:
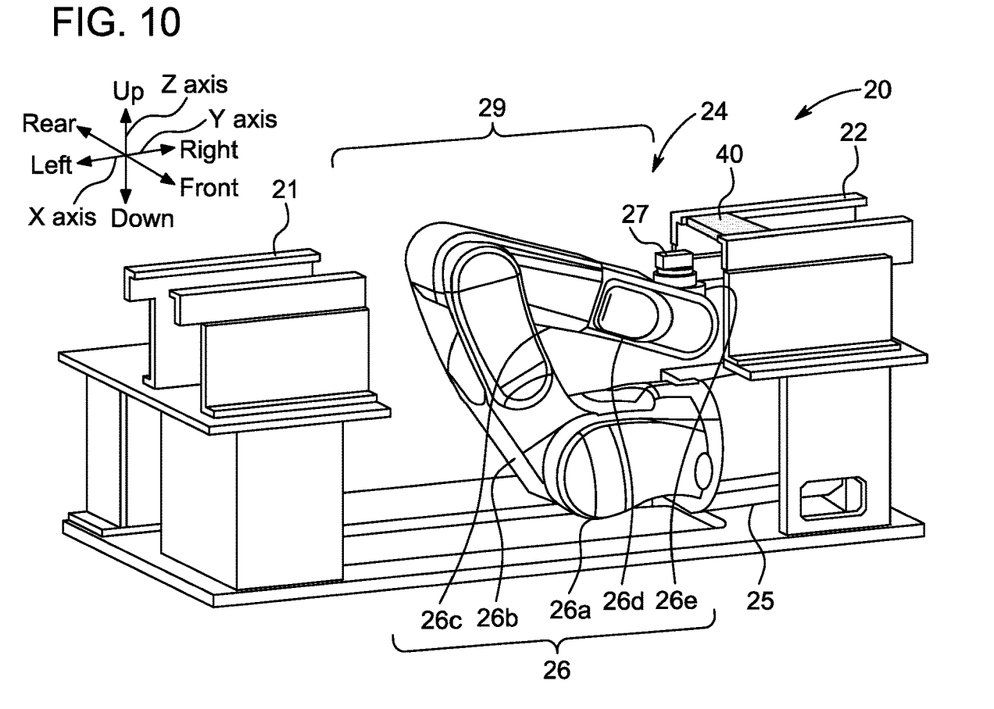
FIG. 10 illustrates supporting and conveying section 20 from which conveyance pallet 40 is released at a discharge position.

Next, CPU 16 causes application section 30 to apply the viscous fluid (S140), and causes mounting section 35 to arrange the component P on the three-dimensional board (S150). Continuing, CPU 16 determines whether there is an unprocessed next forming surface (S160), and if there is a next forming surface, executes S120 and subsequent processes. On the other hand, when there is no next forming surface in S160, that is, when mounting has been performed for all of the forming surfaces, CPU 16 moves conveyance pallet 40 to the discharge position using multi joint robot 24 and releases the attachment by pallet-side attachment section 42 (S170). FIG. 10 illustrates supporting and conveying section 20 from which conveyance pallet 40 is released at a discharge position. CPU 16 controls multi joint robot 24 to move conveyance pallet 40 from the processing position to the discharge position, loads conveyance pallet 40 on second conveyance section 22, then causes robot-side attachment section 27 to release the grip of pallet-side attachment section 42.

Next, CPU 16 controls second conveyance section 22 to move conveyance pallet 40 to the outlet of the device and unloads the three-dimensional board out of the device (S180). Then, CPU 16 determines whether there is a three-dimensional board to be processed next (S190), and if there is a next three-dimensional board, executes processing from S110. On the other hand, when there is no next three-dimensional board, that is, when the mounting process is completed for all three-dimensional boards, the routine ends. In this manner, with three-dimensional mounting device 11, application processing and mounting processing are performed on each forming surface while changing the posture of the three-dimensional board using conveyance pallet 40.

Next, correspondences between constituent elements of the present embodiment and constituent elements of the disclosure will be clarified. Supporting and conveying section 20 of the present embodiment corresponds to a conveyance device, conveyance pallet 40 corresponds to a pallet, robot-side attachment section 27 corresponds to a robot-side attachment section, pallet-side attachment section 42 corresponds to a pallet-side attachment section, multi joint robot 24 corresponds to a conveyance robot, application head 32 and mounting head 37 correspond to a processing head, head moving sections 31 and 36 correspond to moving sections, application section 30 and mounting section 35 correspond to an XY robot, and control section 15 corresponds to a control section.

In supporting and conveying section 20 of the present embodiment described above, conveyance pallet 40 holding the processing target is used to convey the processing target to and from the loading position and the discharge position. For example, even in a case where the processing target has a special shape, with this device, since the processing target is transported by using conveyance pallet 40 that is a flat plate, handling equivalent to a flat board is possible, and general-purpose conveyance of a processing target can be performed. Further, since pallet-side attachment section 42 is a clamp plate that is detachably fixed, and robot-side attachment section 27 is a mechanical chuck that grips and fixes the clamp plate, it is possible to convey the processing target by fixing the clamp plate having a simple structure to conveyance pallet 40, and it is possible to convey a general-purpose processing target without requiring any special attachment or the like. In particular, even when the number of conveying pallets 40 is increased, the number of clamp plates having a simple structure may be increased, so that it is easy to cope with an increase in production without increasing the cost. Further, supporting and conveying section 20 includes first conveyance section 21 configured to convey the processing target to the loading position, and second conveyance section 22 configured to discharge the processing target from the discharge position, and multi joint robot 24 configured to mount pallet-side attachment section 42 at first conveyance section 21, move conveyance pallet 40, and release pallet-side attachment section 42 at second conveyance section 22. With this device, the processing target can be conveyed between first conveyance section 21 and second conveyance section 22 by using conveyance pallet 40.

Further, since multi joint robot 24 is a vertical multi joint robot, and the axis direction of base portion 25 thereof is fixed in a direction along the horizontal direction, that is, the vertical multi joint robot is fixed horizontally, the height direction can be made more compact than a vertical multi joint robot fixed longitudinally. Further, with this device, since it is easy to move the processing target below a predetermined conveying reference surface such as first conveying section 21 or second conveying section 22, the posture of the processing target can be changed in various directions. Further, in the vertical multi joint robot, since the axis direction of base portion 25 is fixed in the direction along the moving direction (X-axis direction) of the processing target, the vertical multi joint robot can smoothly move the processing target in the moving direction.

Further, in three-dimensional mounting device 11, since the processing target is conveyed by using conveyance pallet 40 holding the three-dimensional processing target, the posture of the processing target can be easily changed in various directions. Thus, with this device, it is possible to perform application processing of a viscous fluid, arrangement processing of a member, and the like from various angles with respect to the three-dimensional processing target.

Meanwhile, it goes without saying that the present disclosure of a three-dimensional mounting device is not limited to the above-mentioned embodiments and various embodiments may be applied within the technical scope of the disclosure.

Figure 11:
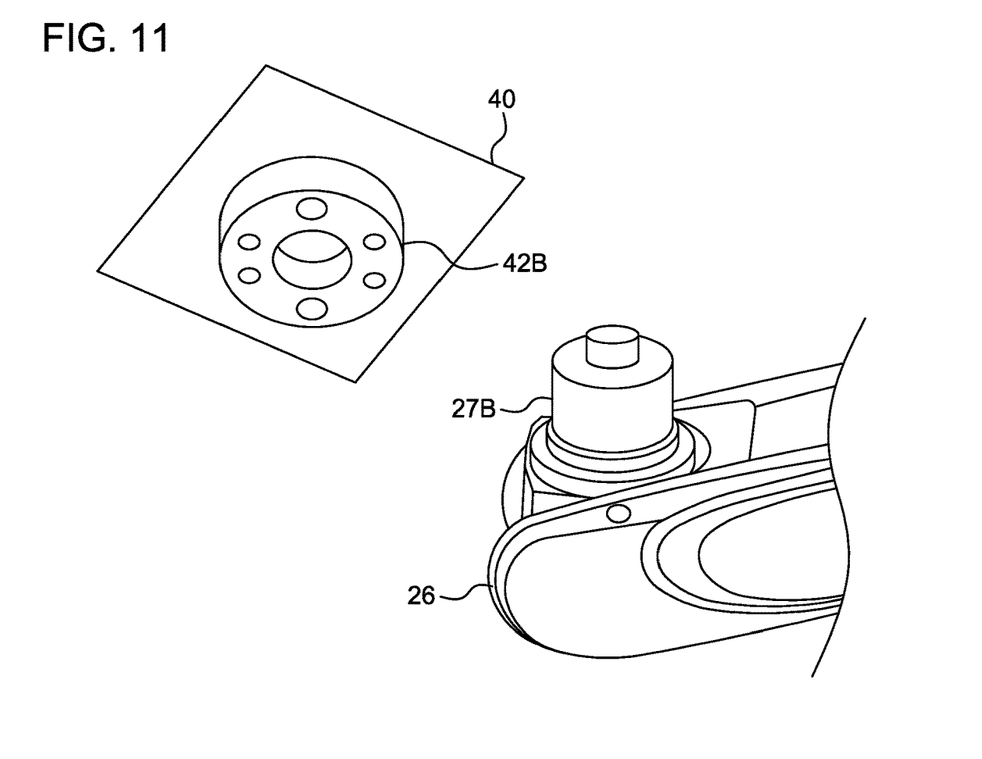
FIG. 11 illustrates robot-side attachment section 27B and pallet-side attachment section 42B.

For example, in an embodiment described above, the pallet-side attachment section 42 is a clamp plate, and robot-side attachment section 27 is a mechanical chuck that grips and fixes the clamp plate, but the configuration is not particularly limited thereto. FIG. 11 illustrates robot-side attachment section 27B and pallet-side attachment section 42B. As shown in FIG. 11, robot-side attachment section 27B and pallet-side attachment section 42B may be configured such that a convex portion is inserted into and fixed to a concave portion. In FIG. 11, robot-side attachment section 27 is a convex portion and a concave portion is formed in pallet-side attachment section 42, but a configuration opposite to this may be used. Further, robot-side attachment section 27B and pallet-side attachment section 42B may be fixed, for example, by suction using negative pressure, or by magnetic force.

In an embodiment described above, multi joint robot 24 is fixed in a direction such that the axis direction of base 25 is along the moving direction (X-axis direction) of the processing target, but for example, multi joint robot 24 may be fixed such that an axis direction of base 25 is along a horizontal direction not restricted to an X-axis direction, that is, multi joint robot 24 may be simply fixed in a lateral position. This device can also save space in the height direction. Alternatively, in an embodiment described above, the axis direction of base 25 is along the horizontal direction, that is, multi joint robot 24 is arranged horizontally, but the configuration is not particularly limited thereto, and multi joint robot 24 may be fixed vertically. With this device also, because conveyance is performed using flat-plate-like conveyance pallet 40, a general-purpose processing target can be conveyed similarly to a flat board. In an embodiment described above, a vertical multi joint robot is used, but the configuration is not particularly limited thereto, and other multi joint robots may be used. Further, in an embodiment described above, multi joint robot 24 having six movable axes is provided, but the quantity of movable axes are not particularly limited thereto, and any number may be present. Note however, if there are four or more movable axes, the degree of freedom in changing the attitude of the processing target is higher, which is desirable. Also, in an embodiment described above, multi joint robot 24 has first to fifth arms 26a to 26e, but the quantity of movable members of arm section 26 may be appropriately selected in accordance with the size of the device, the size of the processing target, and the like.

In an embodiment described above, three-dimensional mounting device 11 is provided with application head 32 and mounting head 37, and the application processing and arranging processing of components P are performed on the three-dimensional board, but one of them may be omitted. With this device also, because conveyance is performed using flat-plate-like conveyance pallet 40, a general-purpose processing target can be conveyed similarly to a flat board.

In an embodiment described above, supporting and conveying section 20 includes first conveyance section 21 and second conveyance section 22, but any one or more of these may be omitted. For example, first conveyance device 21 and the second conveyance device 22 may be disposed outside the device. With this device also, because conveyance is performed using flat-plate-like conveyance pallet 40, a general-purpose processing target can be conveyed similarly to a flat board.

In an embodiment described above, conveyance pallet 40 is moved by multi joint robot 24, but the configuration is not particularly limited thereto, and conveyance pallet 40 may be moved by the XY robot. With this device also, because conveyance is performed using flat-plate-like conveyance pallet 40, a general-purpose processing target can be conveyed similarly to a flat board.

In the conveyance device of the present disclosure, the pallet-side attachment section may be a clamp plate removably fixed to the pallet, and the robot-side attachment section may be a mechanical chuck that grips and fixes the clamp plate. With this device, since the processing target can be conveyed by fixing the clamp plate having a simple structure to the pallet, it is possible to convey a general-purpose processing target without requiring any special attachment or the like.

The conveyance device may include: a first conveyance section configured to convey the processing target to the loading position; and a second conveyance section configured to discharge the processing target from the discharge position, wherein the conveyance robot is configured to mount the pallet-side mounting section at the first conveyance section to move the pallet, and release the pallet-side attachment section at the second conveyance section. With this device, the processing target can be conveyed between first conveyance section 21 and second conveyance section 22 by using a pallet.

With this conveyance device, the conveyance robot may be a vertical multi joint robot, and the axis direction of a base section of the conveyance robot may be fixed in a direction along a horizontal direction. With this device, since the vertical multi joint robot is fixed horizontally, the vertical multi joint robot can be made compact in the height direction as compared with a vertical multi joint robot fixed longitudinally. Further, with this device, since it is easy to move the processing target below a predetermined conveyance reference plane, it is possible to change the posture of the processing target in various directions. In a conveyance device employing such a multi-joint robot, the axis direction of the base portion of the vertical multi joint robot may be fixed in a direction along the moving direction of the processing target. With this device, the processing target can be smoothly moved in the moving direction.

A mounting-related device of the present disclosure includes: an XY robot including a processing head configured to apply a viscous fluid to and/or arrange members on a three-dimensional processing target having multiple mounting surfaces, and a moving section for moving the processing head in a specified plane direction; a conveyance device according to any of the descriptions above, wherein the pallet is held so as to change the attitude of the processing target with respect to the processing head and the pallet is moved between the loading position, the processing position, and the discharge position; and a control section configured to control the XY robot and the conveyance device.

With this device, since the processing target is conveyed by using a pallet holding the three-dimensional processing target, the posture of the processing target can be easily changed in various directions. Thus, with this device, it is possible to perform application processing of a viscous fluid, arrangement processing of a member, and the like from various angles with respect to the three-dimensional processing target. Here, the "viscous fluid" includes, for example, a solder paste, a conductive paste, an adhesive for fixing a component, grease, and the like. Examples of a member include electronic components to be arranged on a circuit board.

INDUSTRIAL APPLICABILITY

A three-dimensional mounting device of the present disclosure can be used in the technical field of a device for performing processing such as collecting, arranging, and the like for a processing target which is a three-dimensional object.

REFERENCE SIGNS LIST

10: mounting system;
11: three-dimensional mounting device;
12: component supply section;
13: component camera;
15: control section;
16: CPU;
17: memory section;
19: three-dimensional data;
20: supporting and conveying section;
21: first conveyance section;
22: second conveyance section;
24: multi joint robot;
25: base section;
26: arm section;
26a: first arm;
26b: second arm;
26c: third arm;
26d: fourth arm;
26e: fifth arm;
27, 27B: robot-side attachment section;
28: drive section;
29: movable space;
30: application section;

31: head moving section;
32: application head;
33: application nozzle;
35: mounting section;
36: head moving section;
37: mounting head;
38: collection section;
40: conveyance pallet;
41: fixing section;
42, 42B: pallet-side attachment section;
50: three-dimensional board;
51, 51a, 51b: forming surface;
52: circuit pattern;
55: three-dimensional board;
56, 56a, 56b, 56c: forming surface;
57: circuit pattern;
60: management PC;
P: component

The invention claimed is:

1. A conveyance device for use in a mounting system including a mounter configured to perform at least one of applying a viscous fluid to a target board and arranging a member on the target board, the conveyance device comprising:
a conveyance robot including a robot-side attachment section arranged at a distal end section of the conveyance robot for mounting a pallet-side attachment section of a pallet which holds the target board; and
a processor configured to control the conveyance robot to
convey the pallet in a mounted state from a loading position to a processing position,
orient the pallet at the processing position so that a forming surface on the target board is horizontal and at a specified height, and
convey the pallet after the processing to a discharge position.

2. The conveyance device of claim 1, wherein the pallet-side attachment section includes a clamp plate removably fixed to a lower surface of the pallet, and the robot-side attachment section includes a mechanical chuck configured to grip and fix the clamp plate from below the pallet.

3. The conveyance device according to claim 1, comprising:
a first conveyor configured to convey the target board to the loading position; and
a second conveyor configured to discharge the target board from the discharge position, wherein
the conveyance robot is configured to mount the pallet-side mounting section at the first conveyor to move the pallet, and release the pallet-side attachment section at the second conveyor.

4. The conveyance device according to claim 1, wherein the conveyance robot is a vertical multi-joint robot, and an axis direction of a base section of the conveyance robot is fixed in a direction along a horizontal direction.

5. The conveyance device according to claim 4, wherein the vertical multi-joint robot is fixed in a direction in which the axis direction of the base section is along a moving direction of the target board.

6. A mounting-related device comprising:
an XY robot including a processing head configured to perform at least one of applying a viscous fluid and arranging members on a three-dimensional target board having multiple mounting surfaces, and a moving section for moving the processing head in a specified plane direction; and
a conveyance robot including a robot-side attachment section arranged at a distal end section of the conveyance robot for mounting a pallet-side attachment section of a pallet which holds the target board; and
a processor configured to control the conveyance robot to
convey the pallet in a mounted state from a loading position to a processing position,
orient the pallet so that one of the mounting surfaces is horizontal and at a specified height, and
control the XY robot to perform at least one of applying the viscous fluid and arranging the members, and
convey the pallet after the processing to a discharge position.

* * * * *